(12) United States Patent
Wang et al.

(10) Patent No.: US 9,363,908 B1
(45) Date of Patent: Jun. 7, 2016

(54) LATCH DEVICE AND SERVER USING THE SAME

(71) Applicants: INVENTEC (PUDONG) TECHNOLOGY CORPORATION, Shanghai (CN); INVENTEC CORPORATION, Taipei (TW)

(72) Inventors: Jia-Bin Wang, Shanghai (CN); Xin-Kai Shi, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 32 days.

(21) Appl. No.: 14/594,697

(22) Filed: Jan. 12, 2015

(30) Foreign Application Priority Data

Nov. 13, 2014 (CN) .......................... 2014 1 0638779

(51) Int. Cl.
*H05K 7/20* (2006.01)
*H05K 5/02* (2006.01)
*H05K 7/14* (2006.01)

(52) U.S. Cl.
CPC ............ *H05K 5/0221* (2013.01); *H05K 7/1488* (2013.01)

(58) Field of Classification Search
CPC ........................... H05K 5/0221; H05K 7/1488
USPC ........................................................ 361/732
See application file for complete search history.

(56) References Cited

U.S. PATENT DOCUMENTS

| 3,634,732 | A | * | 1/1972 | Finger ...................... H04B 1/08 312/7.1 |
| 4,501,460 | A | * | 2/1985 | Sisler ...................... G06F 1/181 361/679.58 |
| 6,181,552 | B1 | | 1/2001 | Neville, Jr. et al. |
| 6,802,108 | B2 | | 10/2004 | Haselby et al. |
| 8,854,823 | B2 | * | 10/2014 | Wallace ............... H05K 7/1489 361/679.37 |
| 2007/0211422 | A1 | | 9/2007 | Liu et al. |
| 2011/0267774 | A1 | * | 11/2011 | Lin .......................... G06F 1/181 361/679.58 |
| 2016/0057887 | A1 | * | 2/2016 | Conn ..................... H05K 7/183 361/679.58 |

FOREIGN PATENT DOCUMENTS

| TW | M308438 | 3/2007 |
| TW | I362452 | 4/2012 |
| TW | M460309 | 8/2013 |

* cited by examiner

*Primary Examiner* — Anthony Q Edwards
(74) *Attorney, Agent, or Firm* — Kirton McConkie; Evan R. Witt

(57) ABSTRACT

A latch device is provided herein, which includes a base fixedly disposed on a chassis and having an abutting side, an accommodating frame fixedly disposed on a top cover and having two bumped spring tabs on two inner sides thereof, and a rotatable handle hinged with the accommodating frame by a hinge. The rotatable handle has two openings at an end thereof near to the hinge and two holes at another end thereof far from the hinge. The rotatable handle is rotated to engage and interact the opening with the abutment side, so that the top cover engagedly covers or is separated from the chassis. The bumped spring tab is snapped into the hole after engagedly covering or before separated.

9 Claims, 16 Drawing Sheets

LATCH DEVICE AND SERVER USING THE SAME

FIELD OF THE INVENTION

The present invention relates to a field of mechanical structural techniques, and particularly to a latch device which can be used for smoothly assembling and disassembling a top cover and a server using the same.

BACKGROUND OF THE INVENTION

In recent years, with the increasing development on technologies, the serviceability of electronic products and their accessories has become more popularly and developed toward a light and compact design in sizes, so as to provide a higher convenience. By minifying the electronic products and their accessories, the assembling of the electronic products and accessories is becoming more and more difficult. For the convenience on assembling the electronic products and their accessories, all components of the electronic products and their accessories are firstly assembled within a chassis of the electronic products and accessories, always, and then the chassis is closed by using a top cover.

Please refer to FIGS. 1A and 1B, which respectively show structural schematic diagrams of an electronic product, such as a server, and its accessories. A top cover 10 is disposed on a chassis 11 and used for closing the chassis 11. A button 12 is disposed on the top cover 10 and connected with a lock 13 which is disposed within the top cover 10 and located under the button 12. The chassis 11 is provided with an engagement section 14 located on a sidewall thereof and correspondingly engaged with the lock 13 so as to fix the top cover 10 on the chassis 11. When the top cover 10 needs to be removed from the chassis 11, the button 12 is pressed to snap the lock 13 out of the engagement section 14, thereby unfixing the top cover 10 from the chassis 11, and then the top cover 10 could be moved for removing the top cover 10 from the chassis 11 to disassemble the top cover 10.

However, when pressing the button 12, the lock 13 may become stuck, so that it fails to separate from the engagement section 14, and the top cover 10 is thus hard to be disassembled.

SUMMARY OF THE INVENTION

A technical problem which the present invention intends to resolve is to accomplish smoothly assembling and disassembling a top cover with relation to a chassis by providing a latch device and a server using the same.

In order to solve the above-mentioned problems, the present invention provides a latch device, comprising: a base fixedly disposed on a chassis and having an abutting side, an accommodating frame fixedly disposed on a top cover and having two bumped spring tabs on two inner sides thereof, and a rotatable handle hinged with the accommodating frame by a hinge. The rotatable handle has two openings at an end thereof near to the hinge and two holes at another end thereof far from the hinge. The rotatable handle is rotated to engage and interact the opening with the abutment side, so that the top cover engagedly covers or is separated from the chassis, and the bumped spring tab is snapped into the hole after engagedly covering or before separated.

In one embodiment, the accommodating frame has a recess which accommodates the rotatable handle therein while engagedly covering.

In one embodiment, the rotatable handle has a locking structure at another end thereof far from the hinge. The accommodating frame has a stopping section. The locking structure is opened or closed with respect to the stopping section by screwing the locking structure when the rotatable handle is engaged.

The present invention further provides a server having a latch device, comprising a chassis, a top cover engagedly covering the chassis, and a latch device fixedly disposed on the top cover. The latch device comprises a base fixedly disposed on the chassis and having an abutting side, an accommodating frame fixedly disposed on the top cover and having two bumped spring tabs on two inner sides thereof, and a rotatable handle hinged with the accommodating frame by a hinge. The rotatable handle has two openings at an end thereof near to the hinge and two holes at another end thereof far from the hinge. The rotatable handle is rotated to engage and interact the opening with the abutment side, so that the top cover engagedly covers or is separated from the chassis, and the bumped spring tab is snapped into the hole after engagedly covering or before separated.

In one embodiment, the rotatable handle has a locking structure at another end thereof far from the hinge. The accommodating frame has a stopping section. The locking structure is opened or closed with respect to the stopping section by screwing the locking structure when the rotatable handle is engaged.

In one embodiment, the accommodating frame has a recess which accommodates the rotatable handle therein while engagedly covering.

In one embodiment, both sides of the chassis are provided with a plurality of bayonet slots, the top cover are provided with a plurality of first positioning pins on both sides thereof. The first positioning pins are engaged with or separated from the bayonet slots when the top cover engagedly covers or is separated from the chassis.

In one embodiment, the chassis is provided with a plurality of position-limiting holes on a rear edge thereof, the top cover is provided with a plurality of second positioning pins on a rear edge thereof. The second positioning pins are engaged with or separated from the position-limiting holes when the top cover engagedly covers or is separated from the chassis.

In one embodiment, the chassis is provided with a plurality of locking tongues on a front portion thereof, the top cover is provided with a plurality of arch-shaped position-limiting sections on a front portion thereof. The locking tongues are engaged with or separated from the arch-shaped position-limiting sections when the top cover engagedly covers or is separated from the chassis.

A advantage of the present invention is that when pushed or pulled, the rotatable handle of the latch device is rotated to engage and interact the opening with the abutment side, so that the top cover engagedly covers or is separated from the chassis, and the bumped spring tab is snapped into the hole after engagedly covering or before separated, so as to accomplish smoothly assembling and disassembling the top cover with relation to the chassis, and also so as to avoid disassembling the top cover from becoming difficulty resulted from latch deadlock in the prior art. Furthermore, the latch device of the present invention is not made of any plastic components or die-casting components. A rotation motion of the rotatable handle can be converted into a horizontal movement of the top cover by only using common stamped components and rivet assembly types, thereby being capable of simplifying its manufacturing process.

DETAILED DESCRIPTION OF THE INVENTION

A latch device and a server using the same according to a preferred embodiment of the present invention will be introduced in detail by referring to those figures.

Figure 1A:
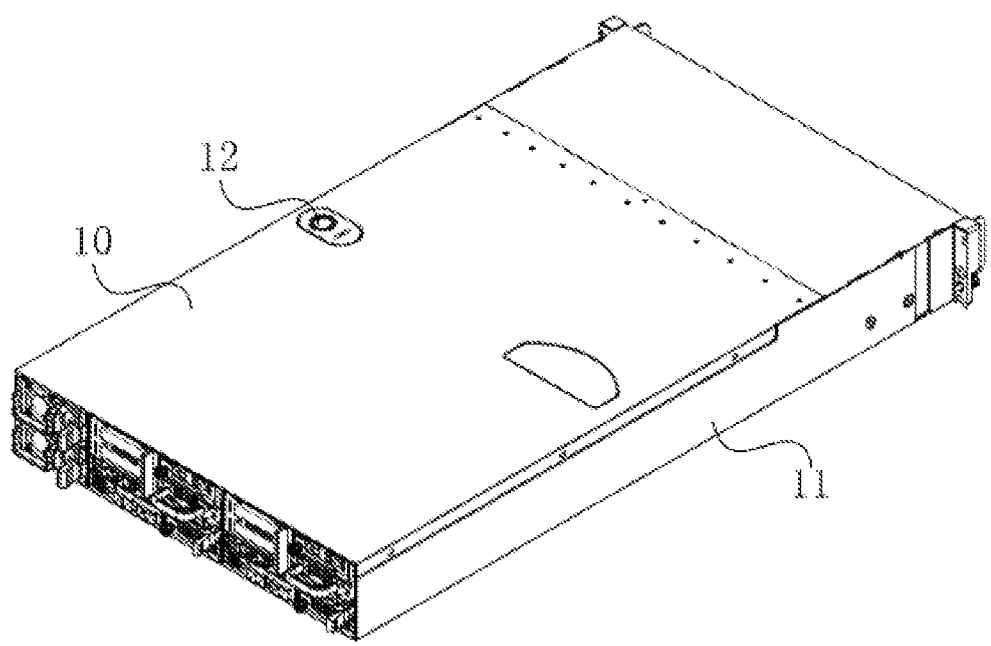
FIG. 1A depicts a structural schematic diagram of an electronic product and accessories thereof in the prior art.
Figure 1B:
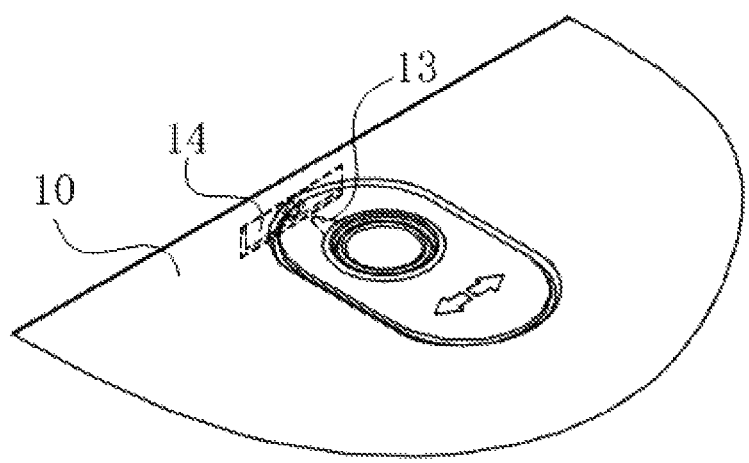
FIG. 1B depicts a partial enlarged schematic diagram of the accessories of the electronic product in the prior art.
Figure 2:
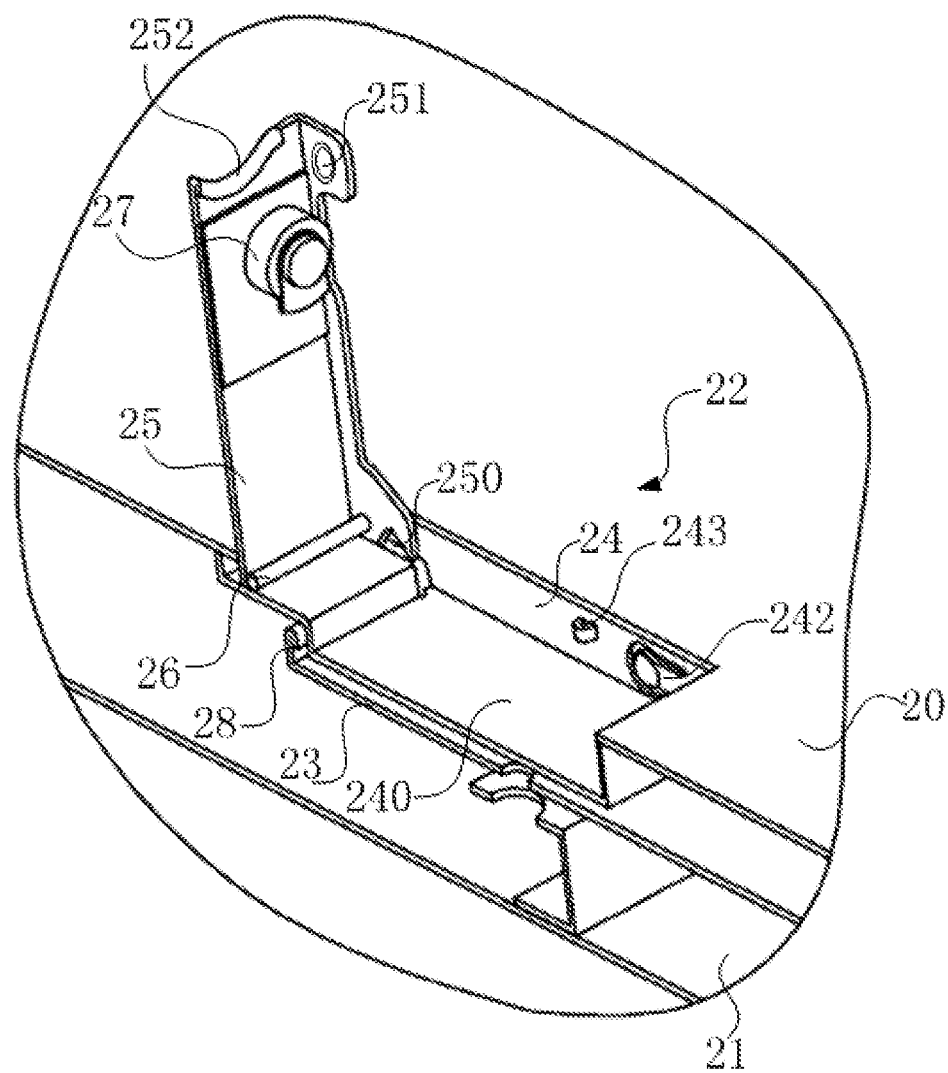
FIG. 2 depicts a stereographically cross-sectional schematic diagram of a latch device disposed on an electronic product in the present invention.

Referring to FIG. 2, a latch device 22 provided by the present invention is suited for deploying on an electronic product, such as a server. The server comprises a top cover 20 and a chassis 21. A user can firmly fix or easily unfix the top cover 20 with respect to the chassis 21 by using the latch device 22, thereby smoothly moving the top cover 20 with respect to the chassis 21.

Figure 3:
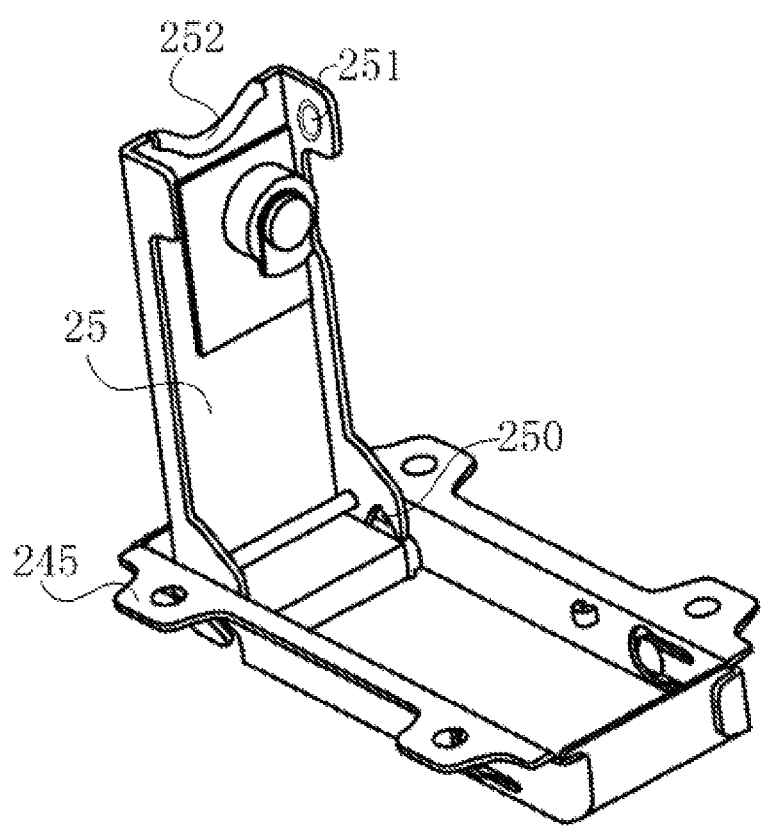
FIG. 3 depicts a structural schematic diagram of the latch device in the present invention, where a rotatable handle is opened.
Figure 4:
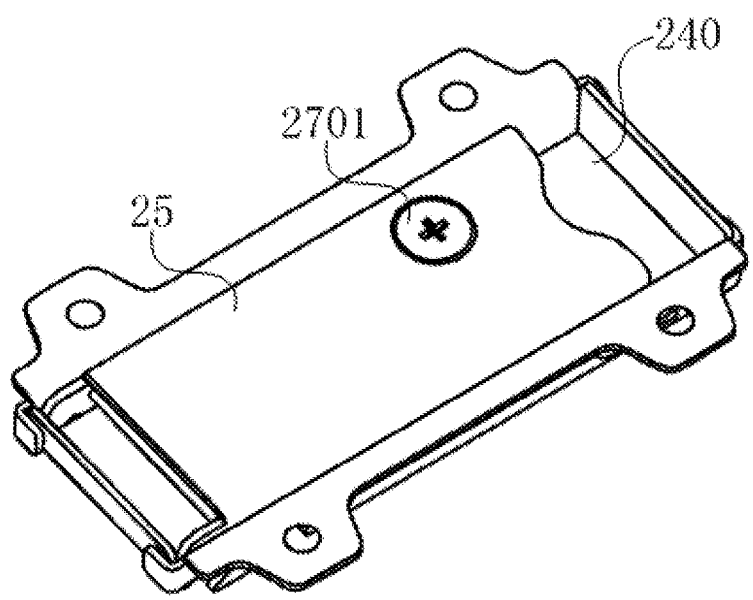
FIG. 4 depicts a structural schematic diagram of the latch device in the present invention, where the rotatable handle is closed.

Referring to FIGS. 2, 3, and 4, the latch device 22 comprises a base 23, an accommodating frame 24, and a rotatable handle 25.

The base 23 is fixedly disposed on a chassis 21 and has an abutting side 28. The accommodating frame 24 is fixedly disposed upon a top cover 20 and has two bumped spring tabs 242 on two inner sides thereof.

The rotatable handle 25 is hinged with the accommodating frame 24 by a hinge 26, so that the rotatable handle 25 is rotated between a first position and a second position. Referring to FIG. 3; the first position is a position where the rotatable handle 25 is perpendicular to the accommodating frame 24, i.e. the latch device 22 is in an opened status. Referring to FIG. 4; the second position is a position where the rotatable handle 25 is parallel with the accommodating frame 24, i.e. the latch device 22 is in a closed status. In another embodiment of present invention, the rotatable handle 25 is hinged with one or two inner side walls of the accommodating frame 24 by other mechanical connection manners, for example, respectively hinging with two inner side walls of the accommodating frame 24 by using two short hinges.

The rotatable handle 25 has two openings 250 at an end thereof near to the hinge 26 and two holes 251 at another end thereof far from the hinge 26. The rotatable handle 25 is rotated to engage and interact the openings 250 with the abutment side, so that the top cover 20 engagedly covers or is separated from the chassis 21. The bumped spring tabs 242 are snapped in the holes 251 after engagedly covering or before separated.

Furthermore, the accommodating frame 24 has a recess 240 which accommodates the rotatable handle 25 therein while engagedly covering.

The rotatable handle 25 is rotated between the first position and the second position. Each opening 250 is engaged with the base 23. When the rotatable handle 25 is rotated from the first position to the second position, the abutting side 28 of the base is squeezed by a side of the opening 250, and the latch device 22 is pushed and moved toward a first direction L1 (see FIG. 6) with respect to the base 23, thereby making the top cover 20 move toward the first direction L1 with respect to the chassis 21. When the rotatable handle 25 is rotated from the second position to the first position, the abutting side 28 of the base is squeezed by the other side of the opening 250, and the latch device 22 is pushed and moved toward a second direction L2 opposite the first direction L1 with respect to the base 23, thereby making the top cover 20 move toward the second direction L2 with respect to the chassis 21.

Referring to FIG. 2, when a user rotates the rotatable handle 25 from the first position to the second position until the hole 251 and the bumped spring tab 242 are connected, the rotatable handle 25 exerts an outward force on the bumped spring tab 242, so that the bumped spring tab 242 is elastically deformable in a direction far from the accommodating frame 24. On the other hand, when a user pulls up the rotatable handle 25 which is fixed within the accommodating frame 24, the bumped spring tab 242 is separated from the hole 251, and the rotatable handle 25 exerts an opposite force on the bumped spring tab 242, so that the bumped spring tab 242 is elastically deformable in a direction far from the accommodating frame 24.

Furthermore, referring to FIGS. 2 and 4, the rotatable handle 25 is provided with a depression 252 at an end thereof far from the hinge 26 and along a long side direction of the rotatable handle 25. An interval is formed between the depression 252 and an end portion of the accommodating frame 24, so that it is convenient for pulling out the rotatable handle 25 from the recess 240. If the rotatable handle 25 needs to be pulled up when the rotatable handle 25 is fixed within the accommodating frame 24, a user can pull up the rotatable handle 25 through the position of the depression 252.

Figure 5:
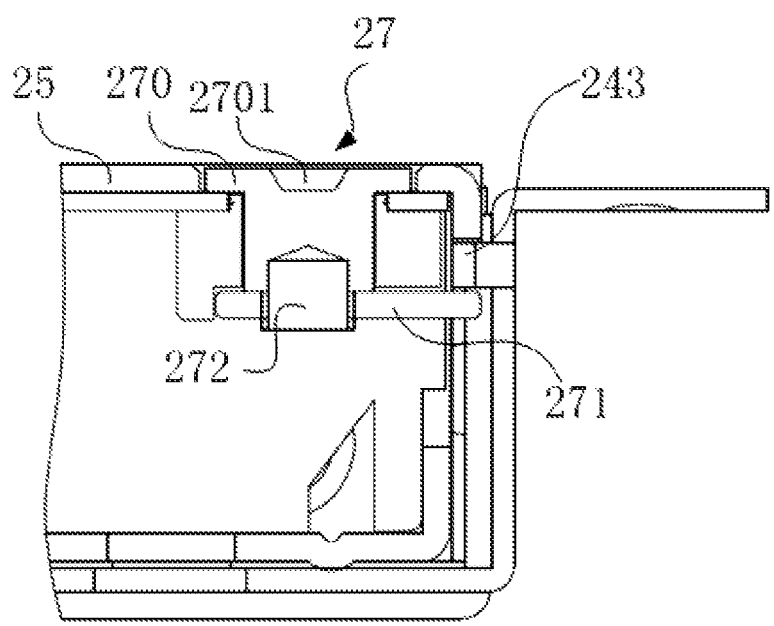
FIG. 5 depicts a schematic diagram of a locking structure.

Furthermore, referring to FIGS. 2, 3, and 5, the rotatable handle 25 further comprises a locking structure 27. The locking structure 27 comprises a rotating section 270 embedded in the rotatable handle 25 and a ratchet piece 271 disposed on an inner side of the rotatable handle 25. The rotating section 270 has a screw head section 2701 which is exposed to a surface of the rotatable handle 25, so that it is convenient for a user to control the rotation of the rotating section 270 through the screw head section 2701. The screw head section 2701 is labeled with a lock mark and an unlock mark, and it is simple for the user to use. The rotating section 270 is connected with the ratchet piece 271. Furthermore, the rotating section 270 may be connected with the ratchet piece 271 by a screw bolt 272. The rotating section 270 will drive the ratchet piece 271 to rotate. In this embodiment, the rotating section 270 may drive the ratchet piece 271 to rotate by 90 degrees. The accommodating frame 24 is provided with a stopping section 243 on an inner side wall thereof. The ratchet piece 271 may be rotated to under the stopping section 243. The stopping section 243 is used for restricting the up and down movement of the ratchet piece 271, so that a rotation of the rotatable handle 25 relative to the accommodating frame 24 is prevented.

When the screw head section 2701 directs an unlocked position, the ratchet piece 271 is located under the stopping section 243. The stopping section 243 restricts the up and down movement of the ratchet piece 271, so that a rotation of the rotatable handle 25 relative to the accommodating frame 24 is prevented. When a user rotates the screw head section 2701, it is movable from its locked position into its unlocked position. The screw head section 2701 drives the rotating section 270 to rotate, thereby rotating the ratchet piece 271, so that the ratchet piece 271 is separated from the stopping section 243, and the rotatable handle 25 can rotate relative to the accommodating frame 24.

Furthermore, referring to FIGS. 2 and 3, the accommodating frame 24 is provided with at least one fixing section 245 on the edge thereof, and the fixing section 245 is facing the top cover 20. The latch device 22 is fixed on the top cover 20 through the fixing section 245. The fixing section 245 may be fixed on the top cover 20 by mechanical joint elements such as screws. In this embodiment, the number of the fixing sections 245 is four, and these are used for firmly fixing on the top cover 20, but the number of the fixing sections 245 is not limited thereto.

Figure 6:
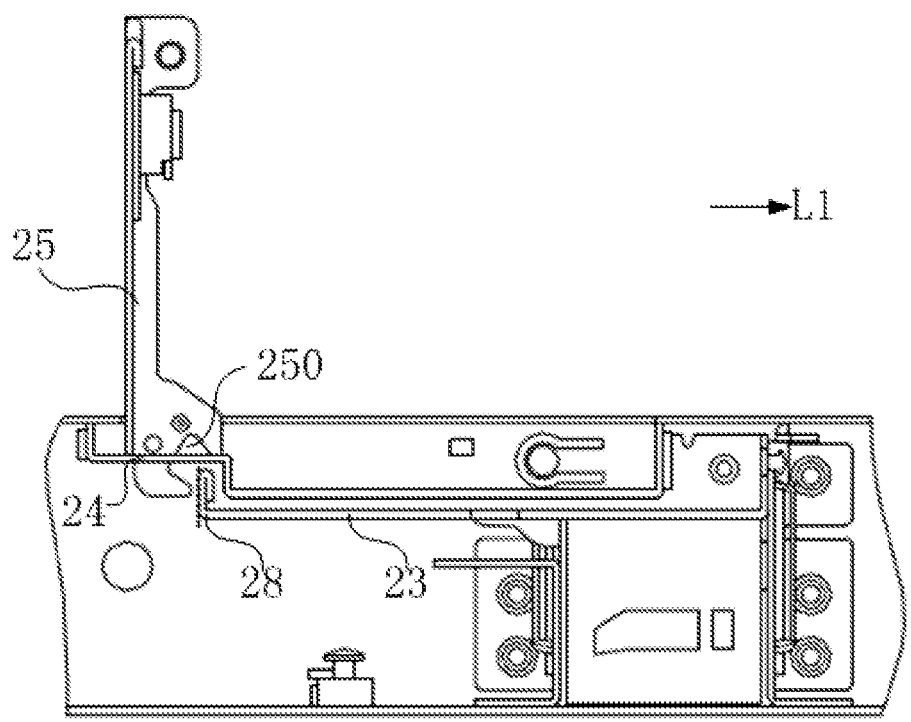
FIG. 6 to FIG. 8 depict schematic diagrams of the latch device during a process of a closed motion in the present invention.
Figure 7:
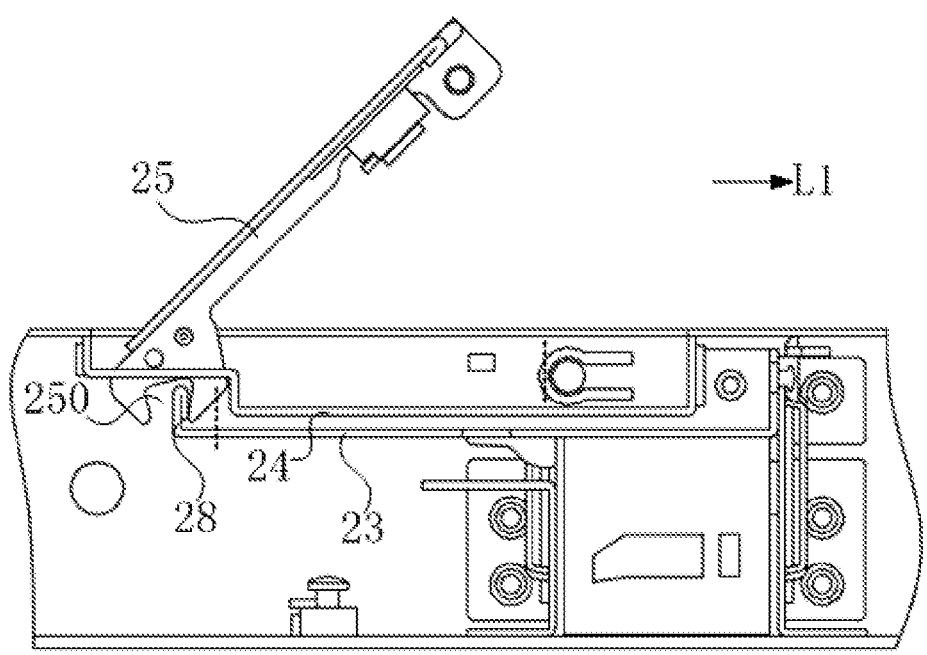
Figure 8:
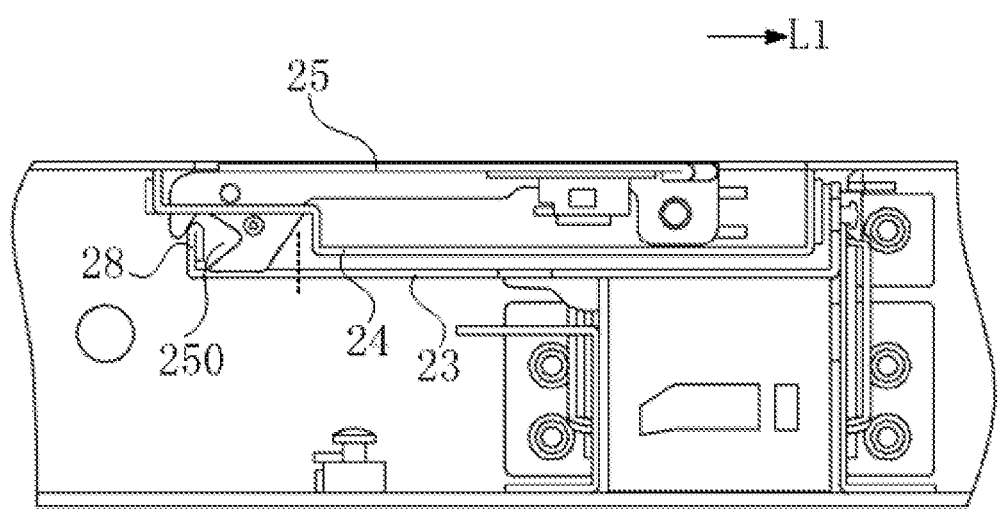

A motion process of the present invention will be introduced in detail by referring to FIG. 6 to FIG. 8.

Referring to FIG. 6, the rotatable handle 25 is in the first position, i.e. an initial status, the rotatable handle 25 is perpendicular to the accommodating frame 24, and the base 23 is near the accommodating frame 24, and the base 23 is facing the opening 250. In an initial position, an end of the accommodating frame 24 is indicated with a dashed line shown in the figure.

Referring to FIGS. 2 and 7, the rotatable handle 25 is pushed and rotated from the first position to the second position. The base 23 is connected with and squeezed by a side wall of the opening 250. The base 23 is a fixed element. When the base 23 is squeezed by the side wall of the opening 250, the base 23 will not move. The rotatable handle 25 receives an action force from base 23, and the rotatable handle 25 is moved relative to the base 23, thereby pushing the latch device 22 to move toward the first direction L1 relative to the chassis 21. Since the rotatable handle 25 is hinged with an inner wall of the accommodating frame 24, the rotatable handle 25 drives the accommodating frame 24 to rotate, thereby moving the latch device 22 toward the first direction L1 relative to the base 23. A rotate motion of the rotatable handle 25 is transformed into a horizontal movement of the latch device 22. Since the latch device 22 is fixedly disposed on the top cover 20, the latch device 22 drives the top cover 20 to move horizontally toward the first direction L1 relative to the chassis 21. Further, the rotate motion of the rotatable handle 25 is transformed into a horizontal movement of the top cover 20, so that the top cover 20 is assembled on the chassis 21. In the initial position, an end of the accommodating frame 24 is indicated with a dashed line shown in the figure.

Referring to FIGS. 2 and 8, the rotatable handle 25 is pushed, so as to move the latch device 22 toward the first direction L1 relative to the base 23, and to drive the top cover 20 to move horizontally toward the first direction L1 relative to the chassis 21. The base 23 is touched and abutted on another side of the opening 250. The latch device 22 stops to move relative to the base 23. The rotatable handle 25 is in the second position. The hole 251 of the rotatable handle 25 is engaged with the bumped spring tab 242. As shown in FIG. 8, the rotatable handle 25 is fixedly disposed in the accommodating frame 24, so as to prevent the rotation of the rotatable handle 25, and the top cover 20 is fixed on the chassis 21. Furthermore, after the rotatable handle 25 is rotated to the second position, the rotating section 270 is rotated by controlling the screw head section 2701 of the locking structure 27, so as to drive the ratchet piece 271 to rotate under the stopping section 243, thereby preventing the rotation of the rotatable handle 25 relative to the recess 240. In the initial position, an end of the accommodating frame 24 is indicated with a dashed line shown in the figure. Thus, the latch device 22 drives the top cover 20 to assemble on the chassis 21.

Figure 9:
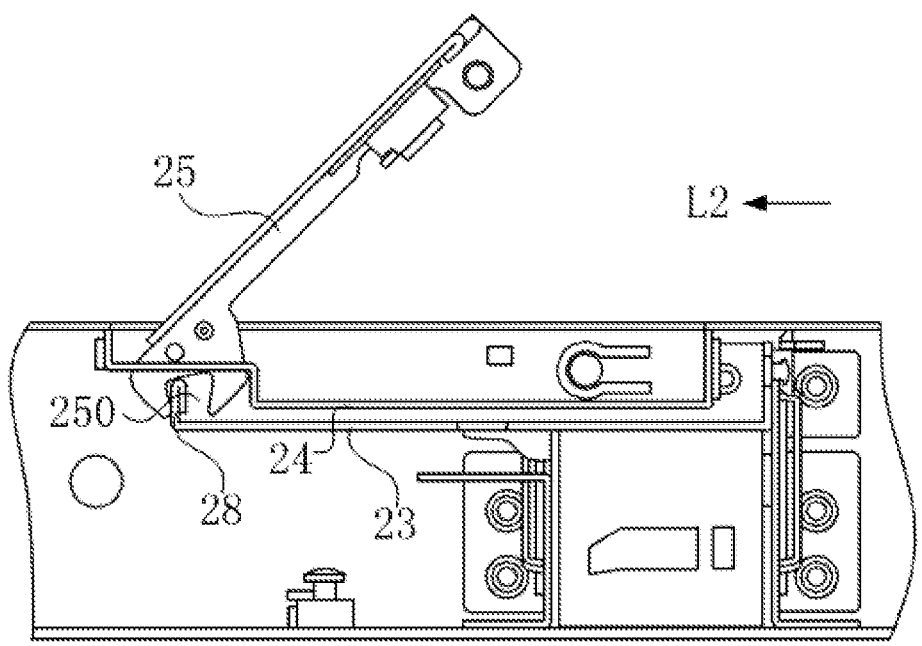
FIG. 9 depicts a schematic diagram of the latch device in a middle status while opened in the present invention.

The above-mentioned process is assembling the top cover 20 on the chassis 21 by using the latch device 22. The process of disassembling the top cover 20 from the chassis 21 the opposite of the above-mentioned assembling process. As shown in FIG. 9, when the top cover 20 is disassembled from the chassis 21, the base 23 is squeezed by another side of the opening 250. The latch device 22 is pushed and moved toward the second direction L2 opposite the first direction L1 relative to the base 23. The top cover 20 is moved horizontally toward the second direction L2 relative to the chassis 21. Further referring to FIGS. 2 and 9, when pulling up the rotatable handle 25 which is fixed on the accommodating frame 24, the bumped spring tab 242 is separated from the hole 251, the bumped spring tab 242 is unengaged with the hole 251, and the bumped spring tab 242 springs back to its original shape, thereby returning to a status shown in FIG. 6. The rotatable handle 25 will not be restricted by the bumped spring tab 242.

Figure 10:
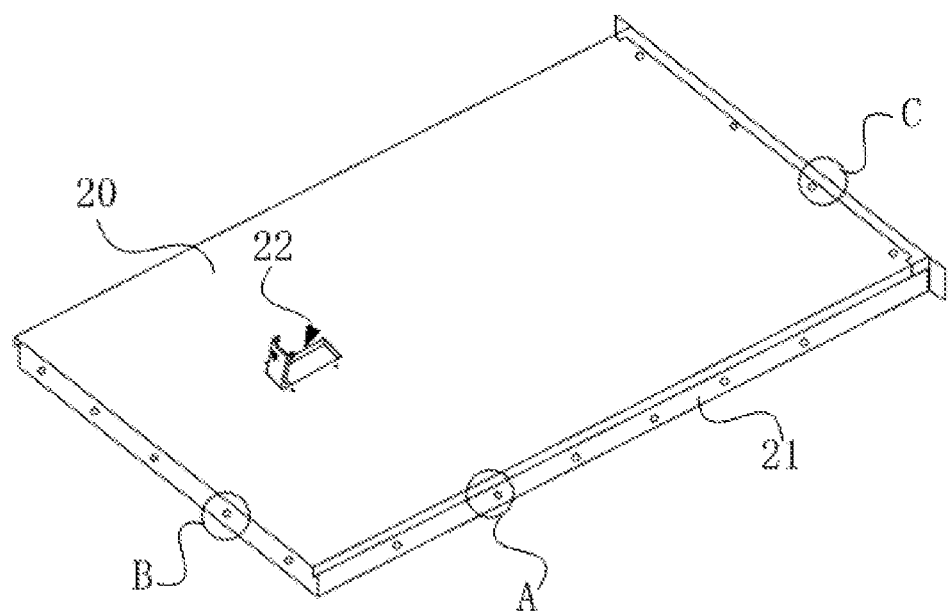
FIG. 10 depicts a structural schematic diagram of a server in the present invention.
Figure 11:
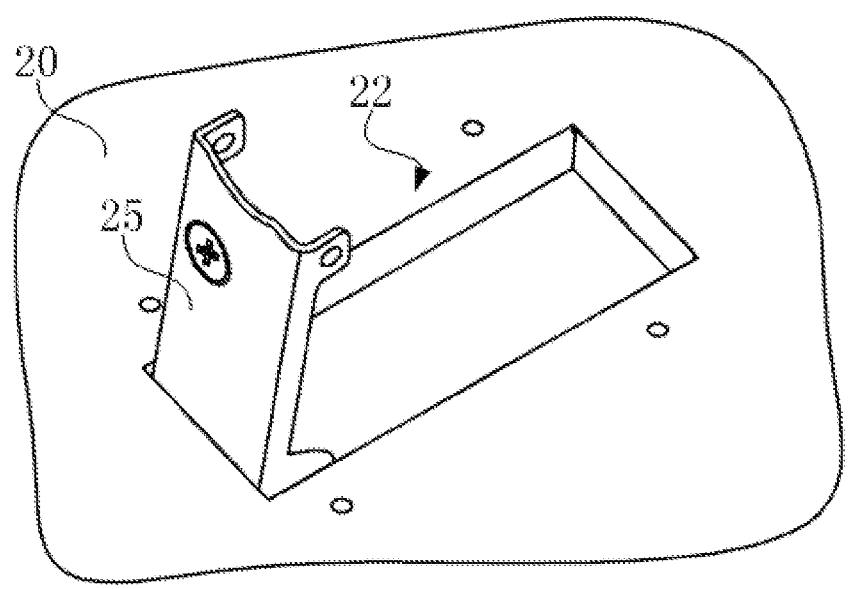
FIG. 11 depicts a schematic diagram of the latch device in the present invention, where a top cover is in an opened status.
Figure 12:
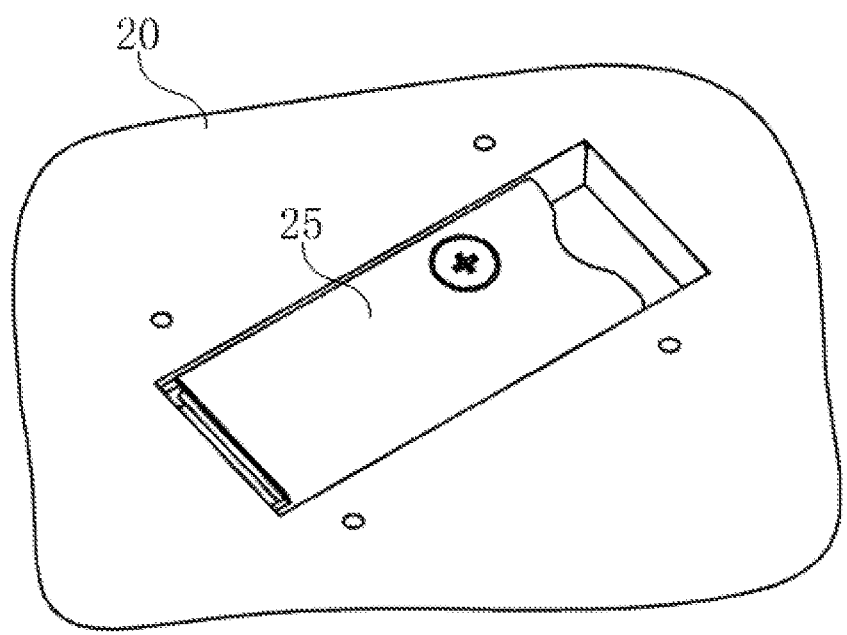
FIG. 12 depicts a schematic diagram of the latch device in the present invention, where the top cover is in a closed status.

Referring to FIG. 10, the present invention further provides a server which uses the above-mentioned latch device 22. The server comprises a chassis 21, a top cover 20 engagedly covering the chassis 21, and a latch device 22 fixedly disposed on the top cover 20. The latch device 22 is embedded in a surface of the top cover 20, and the rotatable handle 25 is exposed. The accommodating frame 24 of the latch device is fixedly connected with the top cover 20, so as to fix the latch device 22 on the top cover 20. The structure of the latch device 22 will not be described in any further detail here. FIGS. 11 and 12 respectively show the latch device 22 disposed on the top cover 20 in an opened status and a closed status.

Figure 13:
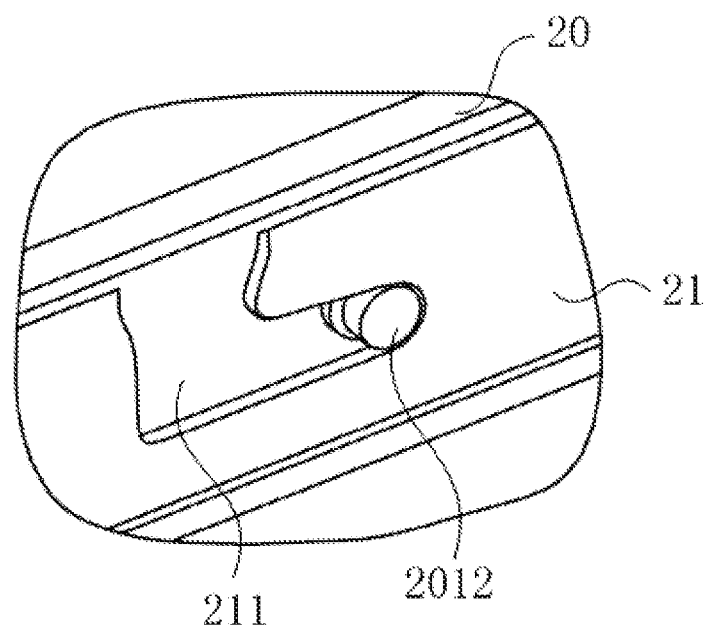
FIG. 13 depicts a structural schematic diagram of a first positioning pin cooperated with an L-shaped bayonet slot.

Please refer to FIGS. 10 and 13. FIG. 13 depicts an enlarged schematic diagram of an A portion shown in FIG. 10. The chassis 21 are provided with a plurality of L-shaped bayonet slots 211 on both sides thereof, the top cover 20 are provided with a plurality of first positioning pins 2012 on both sides thereof. The first positioning pins 2012 are engaged with or separated from the L-shaped bayonet slots 211 when the top cover 20 engagedly covers or is separated from the chassis 21. Furthermore, each first positioning pin 2012 is allowed to move in each L-shaped bayonet slot 211, thereby preventing each first positioning pin 2012 from separating from each L-shaped bayonet slot 211, so that an inner side wall of the top cover 20 is fixed with a corresponding inner side wall of the chassis 21.

Figure 14:
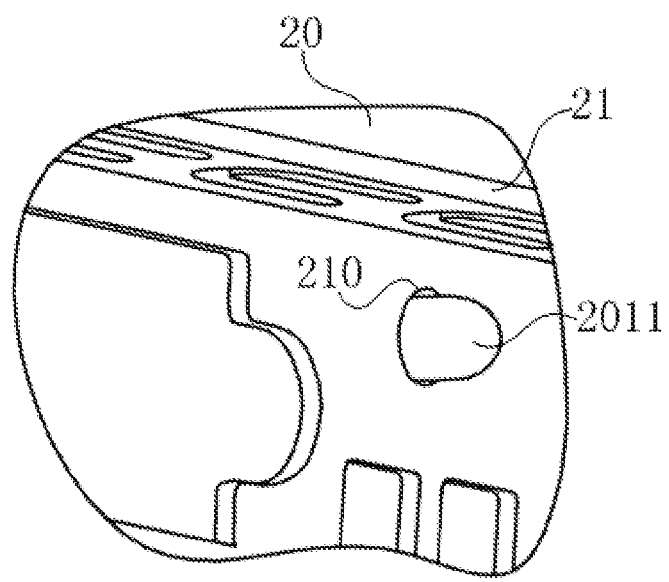
FIG. 14 depicts a structural schematic diagram of a second positioning pin cooperated with a position-limiting hole.

Please refer to FIGS. 10 and 14. FIG. 14 depicts an enlarged schematic diagram of a B portion shown in FIG. 10. The chassis 21 is provided with a plurality of position-limiting holes 210 on a rear edge thereof, and the top cover 20 is provided with a plurality of second positioning pins 2011 on a rear edge thereof. The second positioning pins 2011 are engaged with or separated from the position-limiting holes 210 when the top cover 20 engagedly covers or is separated from the chassis 21, so that the rear edge of the top cover 20 is fixed with the corresponding rear edge of the chassis 21.

Figure 15:
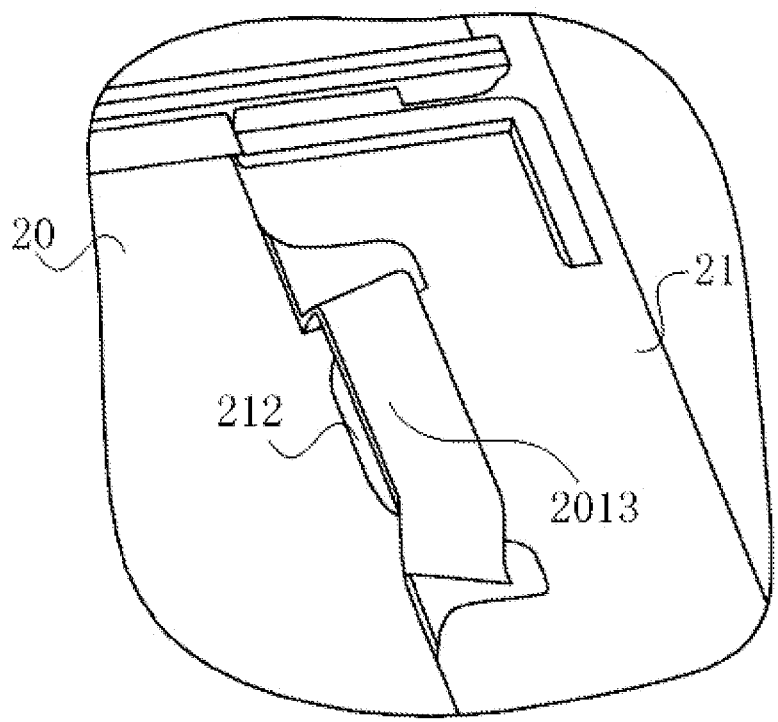
FIG. 15 depicts a structural schematic diagram of an arch-shaped position-limiting section cooperated with a locking tongue.

Please refer to FIGS. 10 and 15. FIG. 15 depicts an enlarged schematic diagram of a C portion shown in FIG. 10.

The chassis 21 is provided with a plurality of locking tongues 212 on a front portion thereof, and the top cover 20 is provided with a plurality of arch-shaped position-limiting sections 2013 on a front portion thereof. The locking tongues 212 are engaged with or separated from the arch-shaped position-limiting sections 2013 when the top cover 20 engagedly covers or is separated from the chassis 21, so that the front portion of the top cover 20 is fixed with the corresponding front portion of the chassis 21.

When the top cover 20 is assembled on the chassis 21, the rotatable handle 25 is rotated from the first position to the second position. The opening 250 of the rotatable handle 25 is engaged with the abutting side 28 of the base 23, and it rotated along the hinge 26. The rotatable handle 25 drives the accommodating frame 24 accompanied with the top cover 20 to move along a first direction L1 relative to the chassis 21 (along a horizontal direction for engaging with each other). The first positioning pin 2012 is engaged with the L-shaped bayonet slot 211. The second positioning pin 2011 is engaged with the position-limiting hole 210. The arch-shaped position-limiting section 2013 is engaged with the locking tongue 212. The bumped spring tab 242 of the accommodating frame 24 is engaged with the hole 251 of the rotatable handle 25. Therefore, the locking structure 27 of the rotatable handle 25 is screwed and engaged with the stopping section 243 of the accommodating frame 24. Thus, the top cover 20 is assembled on the chassis 21.

When the top cover 20 is disassembled from chassis 21, the locking structure 27 of the rotatable handle 25 is screwed and separated from the stopping section 243 of the accommodating frame 24. The hole 251 of the rotatable handle 25 is separated from the bumped spring tab 242 of the accommodating frame 24. The rotatable handle 25 is rotated from the second position to the first position. The opening 250 of the rotatable handle 25 is engaged with the abutting side 28 of the rotatable handle 25, and it rotated along the hinge 26. The rotatable handle 25 drives the accommodating frame 24 accompanying with the top cover 20 to move along a second direction L2 relative to the chassis 21 (along a rear and horizontal direction for opening). The first positioning pin 2012 is separated from the L-shaped bayonet slot 211. The second positioning pin 2011 is separated from the position-limiting hole 210. The arch-shaped position-limiting section 2013 is separated from the locking tongue 212. Therefore, the top cover 20 is disassembled from the chassis 21.

The above descriptions are merely preferable embodiments of the present invention. It should be noted that those of ordinary skill in the art can make improvements and modifications without departing from the principle of the present invention, and all of the improvements and modifications should be contained within the scope of the attached claims of the present invention.

What is claimed is:

1. A latch device, comprising:
   a base fixedly disposed on a chassis and having an abutting side;
   an accommodating frame fixedly disposed on a top cover and having two bumped spring tabs on two inner sides thereof; and
   a rotatable handle hinged with the accommodating frame by a hinge,
   wherein the rotatable handle has two openings at an end thereof near to the hinge, and two holes at another end thereof far from the hinge; and
   the rotatable handle is rotated to engage and interact the opening with the abutment side so that the top cover engagedly covers or is separated from the chassis, and the bumped spring tab is snapped into the hole after engagedly covering or before separated.

2. The latch device according to claim 1, wherein the accommodating frame has a recess which accommodates the rotatable handle therein while engagedly covering.

3. The latch device according to claim 1, wherein the rotatable handle has a locking structure at the another end thereof far from the hinge, the accommodating frame has a stopping section, the locking structure is opened or closed with respect to the stopping section by screwing the locking structure when the rotatable handle is engaged.

4. A server having a latch device, comprising a chassis, a top cover engagedly covering the chassis, and the latch device fixedly disposed on the top cover, the latch device comprising:
   a base fixedly disposed on the chassis and having an abutting side;
   an accommodating frame fixedly disposed on the top cover and having two bumped spring tabs on two inner sides thereof; and
   a rotatable handle hinged with the accommodating frame by a hinge,
   wherein the rotatable handle has two openings at an end thereof near to the hinge, and two holes at another end thereof far from the hinge; and
   the rotatable handle is rotated to engage and interact the opening with the abutment side so that the top cover engagedly covers or is separated from the chassis, and the bumped spring tab is snapped into the hole after engagedly covering or before separated.

5. The server according to claim 4, wherein the rotatable handle has a locking structure at the another end thereof far from the hinge, the accommodating frame has a stopping section, the locking structure is opened or closed with respect to the stopping section by screwing the locking structure when the rotatable handle is engaged.

6. The server according to claim 4, wherein the accommodating frame has a recess which accommodates the rotatable handle therein after engagedly covering.

7. The server according to claim 4, wherein the chassis is provided with a plurality of bayonet slots on both sides thereof, the top cover is provided with a plurality of first positioning pins on both sides thereof, the first positioning pins are engaged with or separated from the bayonet slots when the top cover engagedly covers or is separated from the chassis.

8. The server according to claim 4, wherein the chassis is provided with a plurality of position-limiting holes on a rear edge thereof, the top cover is provided with a plurality of second positioning pins on a rear edge thereof, the second positioning pins are engaged with or separated from the position-limiting holes when the top cover engagedly covers or is separated from the chassis.

9. The server according to claim 4, wherein the chassis is provided with a plurality of locking tongues on a front portion thereof, the top cover is provided with a plurality of arch-shaped position-limiting sections on a front portion thereof, the locking tongues are engaged with or separated from the arch-shaped position-limiting sections when the top cover engagedly covers or is separated from the chassis.

* * * * *